(12) United States Patent
Nordstrom et al.

(10) Patent No.: US 7,936,172 B2
(45) Date of Patent: May 3, 2011

(54) AUTOMATIC TEST EQUIPMENT SELF TEST

(75) Inventors: Kenny Nordstrom, Tempe, AZ (US);
Ralph Jones, Blaine, MN (US);
Krishna Munirathnam, Karnataka (IN)

(73) Assignee: Honeywell International Inc.,
Morristown, NJ (US)

( * ) Notice: Subject to any disclaimer, the term of this patent is extended or adjusted under 35 U.S.C. 154(b) by 246 days.

(21) Appl. No.: 12/242,256

(22) Filed: Sep. 30, 2008

(65) Prior Publication Data
US 2010/0079151 A1 Apr. 1, 2010

(51) Int. Cl.
*G01R 31/02* (2006.01)
(52) U.S. Cl. .................... 324/555; 324/556; 324/73.1
(58) Field of Classification Search .................. 324/555, 324/73.1, 158.1, 765; 714/733
See application file for complete search history.

(56) References Cited

U.S. PATENT DOCUMENTS

| 5,841,788 | A | 11/1998 | Ke |
| 6,269,319 | B1 | 7/2001 | Neisch et al. |
| 6,462,532 | B1 | 10/2002 | Smith |
| 6,622,272 | B1 | 9/2003 | Haverkamp et al. |
| 2004/0186675 | A1 | 9/2004 | Larson et al. |
| 2005/0210352 | A1 * | 9/2005 | Ricchetti et al. ............... 714/733 |
| 2005/0261856 | A1 * | 11/2005 | Kushnick et al. ............ 702/117 |
| 2007/0069737 | A1 | 3/2007 | Van Treuren et al. |
| 2007/0266288 | A1 | 11/2007 | Volkerink et al. |

FOREIGN PATENT DOCUMENTS

WO 0151941 A1 7/2001

OTHER PUBLICATIONS

EP Search Report, EP 09171035.0-2216 dated Dec. 2, 2010.

* cited by examiner

*Primary Examiner* — Vincent Q Nguyen
(74) *Attorney, Agent, or Firm* — Ingrassia Fisher & Lorenz, P.C.

(57) ABSTRACT

A self test adapter (STA) for automatic test equipment (ATE) is provided. The STA includes an enclosure. A backplane is housed by the enclosure. A dual data bus is integrated into the backplane. At least one STA card module is inserted into the backplane. The at least one STA card module has a port for interconnection with an ATE station receiver. The at least one STA card module includes a generic region adapted for interfacing with an additional STA card module over the dual data bus, and a resource specific region adapted for self test of at least one ATE station resource.

12 Claims, 8 Drawing Sheets

AUTOMATIC TEST EQUIPMENT SELF TEST

FIELD OF THE INVENTION

The present invention generally relates to test equipment for electronics systems, and more particularly, but not exclusively, to a self test adapter (STA) for automatic test equipment.

BACKGROUND OF THE INVENTION

Automatic test equipment (ATE) refers to automated devices used to perform testing on electronic systems and devices, such as systems incorporated into automotive, aerospace, marine and other environments. In many industries, such as the aircraft industry, ATE performs valuable diagnostic functionality, such as diagnosis and prognosis of aircraft systems and devices.

ATE devices may be used to quickly and efficiently test electronics devices such as printed circuit boards (PCBs), integrated circuits (ICs), and other related electronic components or modules. ATE devices may be controlled by computers or computing environments, proprietary controllers, or even relay controls.

An ATE system, or resource, may be a simple as a digital multi-meter (DMM) whose operating mode and measurements are controlled and analyzed by a computer, or as complex as a system containing dozens of complex test instruments capable of automatically testing and diagnosing faults in complex electronic systems, such as highly sophisticated flying-probe testers. ATE systems are used to test a wide range of electronic devices and systems, from simple components (resistors, capacitors, and inductors), to ICs, PCBs, and complex, completely assembled electronic systems.

ATE is widely used in the electronic manufacturing industry to test electronics components and systems after they are fabricated. ATE is also used to test avionics systems on commercial and military aircraft. ATE systems are also used to test the electronic modules in today's automobiles.

ATE systems typically interface with an automated placement tool that physically places the devices under test (DUT) so that they may be measured and tested by the equipment. Over the past four decades, ATE has grown from specialized systems for electronics applications to a wide range of applications in many industries incorporating electronic equipment. In many cases, ATE devices are incorporated into a station that houses the ATE resources, such as a DMM or other equipment.

BRIEF SUMMARY OF THE INVENTION

Automatic test station resources need to be functionally validated before the automatic test station is used for testing a product. A production or development automatic test station self test is the automated process of determining that the test station stimulus resources and measurement resources are functionally validated. This validation process is needed prior to testing the Device Under Test (DUT) which reduces faulty test results that could potentially expose the manufacturer to unnecessary risks that include the delivery of a non functional product to the customer or rejecting working product.

Self Test Adapters (STA) are custom built interface units that automate the validation process of instrument functionally by using the installed measurement instrument resources to verify the stimulus instrument or measurement resources. An example is an automatic test station switching resource used to switch a power supply voltage resource to the DMM resource for measurement. This dependency on station resources can increase the cost of automatic test station design due to the dedicated resources for a self test adapter which may not be needed otherwise.

Manufacturing of custom build self test adapters by individual technicians can cause fabrication variances between identical self test adapter designs. Variances include inconsistency of wire lengths, wire crimping to connectors, contact soldering, and wire routing that causes inconsistent path resistance resulting in fluctuating test results from identical self test adapter designs.

Modifications or additions to the self test adaptors to accommodate instrument resource changes increase cost by consuming engineering resources, injecting unforeseen errors and extending the schedule. The engineering effort to add a resource modification to an existing self test adapter design can be involved due to verifying that other instrument resources will not be effected as a result of the modification that might not be obvious at the design phase. The actual modification of the STA may compromise the electrical integrity such as wire breaks caused by moving wires back and forth. As a result, these modifications may increase costs, delays, and cause inaccuracies in obtained test data. In some cases, the engineering design, manufacturing, and cost of acquiring today's complex and specific STA designs may influence a decision to not implement the STA, further increasing risk.

A need exists for a modular, scalable, and generic STA design with an ability to independently validate ATE station resources, yet configurable enough for a user to easily modify. Furthermore, other desirable features and characteristics of the present invention will become apparent from the subsequent detailed description of the invention and the appended claims, taken in conjunction with the accompanying drawings and this background of the invention.

Accordingly in view of the foregoing, in one embodiment, by way of example only, a self test adapter (STA) for automatic test equipment (ATE) is provided. The STA includes an enclosure. A backplane is housed by the enclosure. A dual data bus is integrated into the backplane. At least one STA card module is inserted into the backplane. The at least one STA card module has a port for interconnection with an ATE station receiver. The at least one STA card module includes a generic region adapted for interfacing with an additional STA card module over the dual data bus, and a resource specific region adapted for self test of at least one ATE station resource.

In an additional embodiment, again by way of example only, a system for self testing of automated test equipment (ATE) is provided. The system includes a data bus. Each of a plurality of self test adapter (STA) adapter modules is in communication over the data bus. Each of the plurality of STA modules include a front end circuit for communication between the plurality of STA modules, and a resource circuit for performing test functionality of an ATE resource.

In still another embodiment, again by way of example only, a method of manufacturing a self test adapter (STA) for automatic test equipment (ATE) is provided. An enclosure is provided. A backplane housed by the enclosure is provided. A dual data bus integrated into the backplane is provided. At least one STA card module is provided for insertion into the backplane. The at least one STA card module has a port for interconnection with an ATE station receiver. The at least one STA card module includes a generic region adapted for interfacing with an additional STA card module over the dual data bus, and a resource specific region adapted for self test of at least one ATE station resource.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
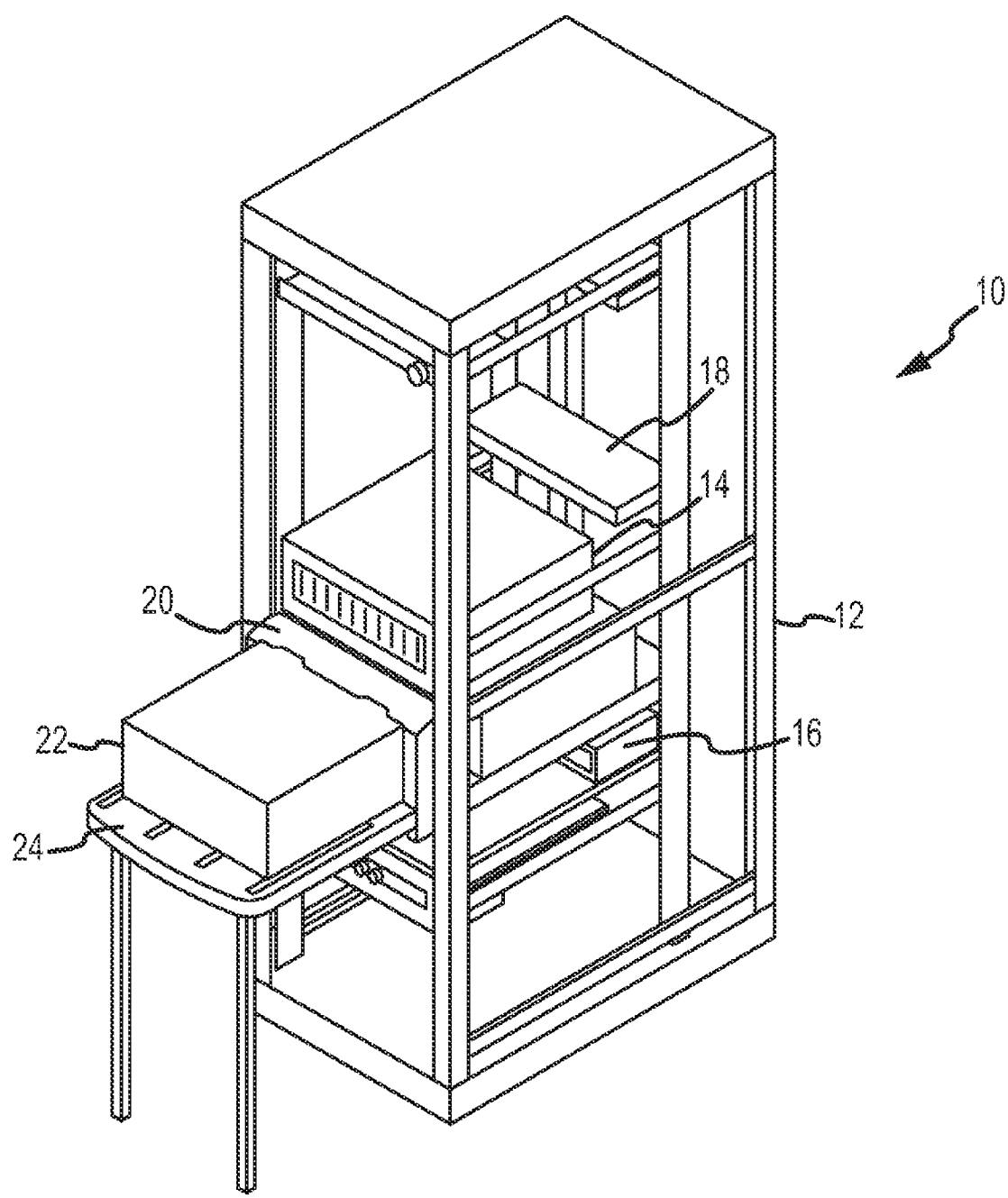
FIG. 1 illustrates an exemplary automatic test equipment (ATE) station and self test adapter (STA)

The following detailed description of the invention is merely exemplary in nature and is not intended to limit the invention or the application and uses of the invention. Furthermore, there is no intention to be bound by any theory presented in the preceding background of the invention or the following detailed description of the invention.

The following description and claimed subject matter present illustrated embodiments of a generic, modular, and scalable self test adapter (STA) for automatic test equipment (ATE) station resources. The illustrate embodiments independently validate commercial ATE station resources, yet are configurable for a user to easily modify for differing ATE station configurations (differing resource combinations or number of resources).

The modular design approach seen in the illustrated embodiments reduces engineering effort, uses standard control software architecture, and provides a common method for testing station resources independently. The initial design time is reduced by providing the design engineer a proven and thorough mechanism that is contained in a self test adapter enclosure housing one or more STA modules. The self test adapter modules route the resource signals to a dual data bus back plane that maps the test station stimulus resources to the measurement resources to functionally test each resource individually.

STA modules are designed with a common structure to control the module functions and with a standard identification method to increase software reuse and to increase confidence in a self test adapter resource module. This methodology eliminates the need for self test adapter re-design, as the modules can be combined in any order and quantity without affecting other test resources.

In one embodiment, the STA modules are incorporated into custom printed circuit boards for the self test resource modules and the dual data bus back plane. These may take the form factor of a card, and will be referred to herein as STA card modules. Each of the STA card modules may be designed to include functionality relating to signal loading, communication loop backs, module activation, module identification, and some parametric testing depending on the particular resource.

Each STA module/STA card module may route signals to the dual data bus back plane to use common instrumentation or a path way to other shared resources. The dual data bus back plane may be adapted to span all modules and provide dual identical busses to provide a method to test half height STA modules. The connectors of the dual data bus back plane may be adapted to have fixed spacing that is derived from the connector spacing of the mass interconnect solution of the ATE station receiver interface. The entire design may be housed in an enclosure that uses the mass interconnect solution to mate the test station resources to the STA modules. Custom software for each type of STA module may be adapted to control functionality and module identification to provide a complete package to a user.

FIG. 1, following, illustrates an exemplary automatic test equipment (ATE) station 10 in which various aspects of the previous description and following claimed subject matter may be implemented. Station 10 includes a computer workstation 14, server, or similar computer system to provide control, monitoring, and recording of various station 10 resources. Various station resources 16 and 18 are integrated into the station 10 and are adapted to be in communication with computer workstation 14. The station resources 16 and 18 may vary from implementation to implementation, depending upon the needs of a user. For example, the resources 16 and 18 may include a DMM as previously described, a power supply, or a similar resource.

A receiver 20 provides an interface between the station 10 and devices under test (DUTs) which are normally placed on the table 24 and interconnected with the station 10. In the depicted embodiment, however, a self test adapter (STA) 22 is interconnected with the receiver 20. The functionality of STA 22, internal components, and architecture will be further described in detail, following. STA 22 includes a number of STA modules/STA card modules that are custom built to facilitate testing of the particular resources implemented in station 10.

Figure 2:
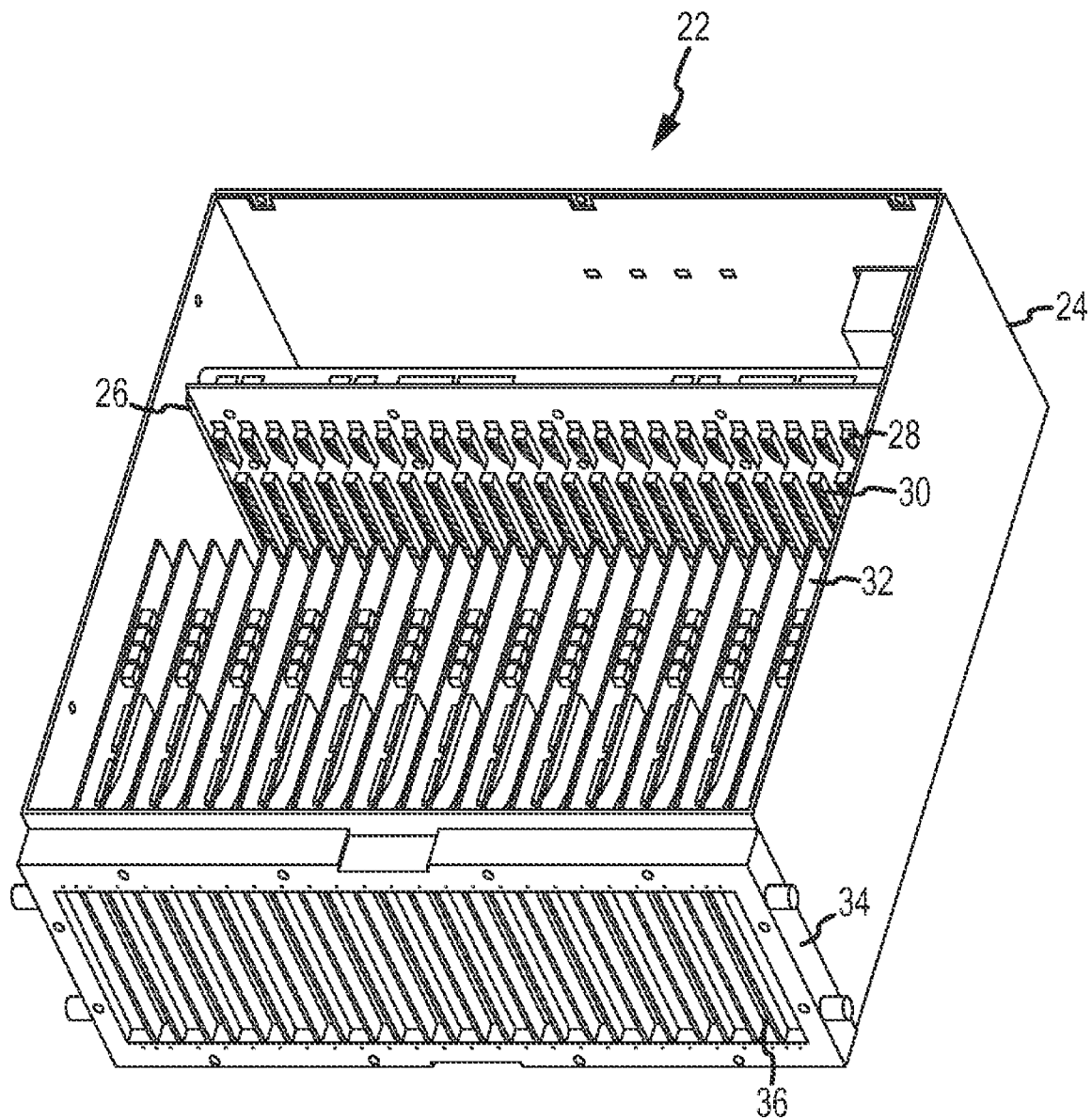
FIG. 2 illustrates a self test adapter (STA) enclosure including an integrated backplane.

Turning to FIG. 2, an exemplary STA 22 is illustrated in additional detail. STA 22 includes an enclosure 24. A backplane 26 is housed within the enclosure 24. Backplane 26 includes a number of connectors with spacing to match the mass interconnect configuration of the ATE station receiver. As will be further described, a dual data bus is integrated into the backplane 26. The dual data bus provides interconnectivity between STA modules as placed within the enclosure 24.

In one embodiment, backplane 26 may include multiple layers integrated into a PCB form factor. Ground lines may be incorporated into the backplane 26 to reduce signal noise. Other design features may be taken into account to boost performance, such as the incorporation of additional copper to decrease resistance.

A number of connectors 28 and 30 are integrated into the backplane 26. Connectors 28 and 30 provide data connectivity between STA modules and the backplane 26 as will be further described. A bracket 34 is disposed on the enclosure 24 as shown. In one embodiment, bracket 34 provides mounting and structural support for a number of STA cards inserted into the enclosure 24 and connected to the backplane 26. Bracket 34 includes a number of equispaced slots 36 in which the connector(s) of each of the STA cards interface with the ATE receiver 20 (FIG. 1).

Figure 3:
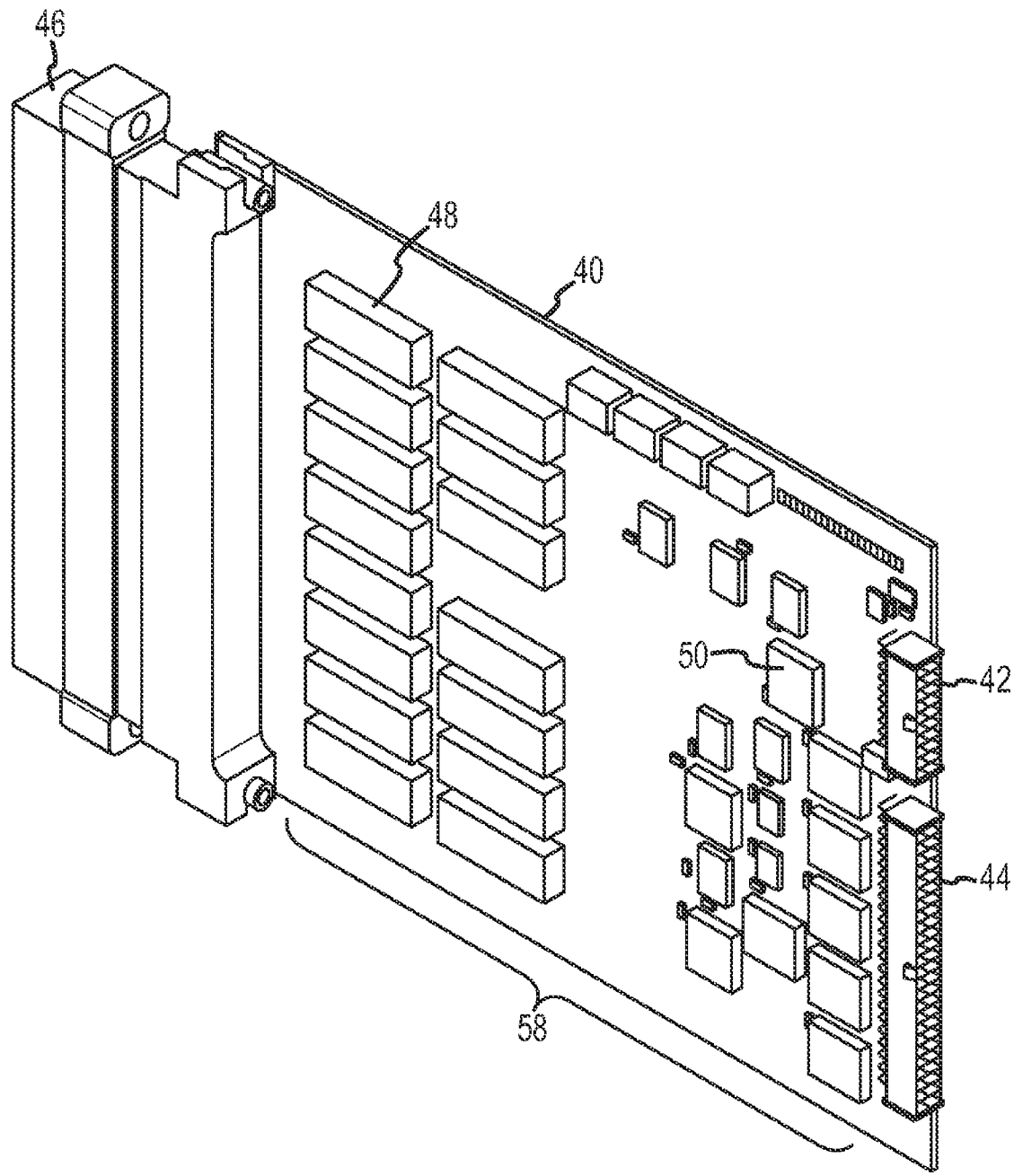
FIG. 3 illustrates a STA card incorporating at least one STA module.

FIG. 3 illustrates an exemplary STA card module 40 for insertion into the enclosure 24 (FIG. 2). STA card module 40 includes at least one STA module 58 that is incorporated into a PCB as shown. The STA module 58 may include ICs, for example. STA module 58 as depicted includes a relay device 48 and a line driver 50 for processing I/O signals through the card 40. Connectors 42 and 44 allow for I/O connectivity between the card 40 and the backplane 26/dual data bus (FIG.

2). Connector 46 allows for I/O connectivity between the card 40 and an ATE station receiver 20 (FIG. 1).

Figure 4:
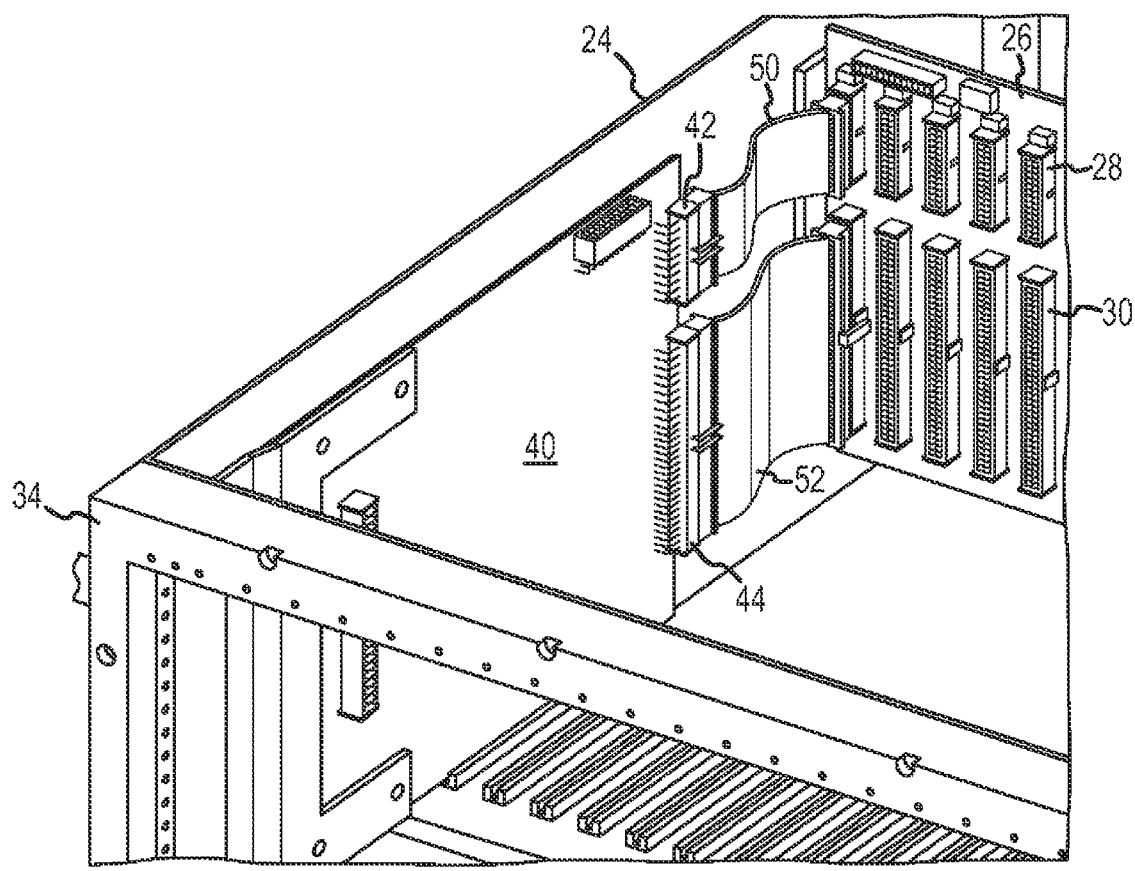
FIG. 4 illustrates an interconnection between the STA card illustrated FIG. 3 and the backplane illustrated in FIG. 2.

FIG. 4 illustrates the interconnectivity between STA card module 40 and the backplane 26 in enclosure 24. Here again, enclosure 24 includes backplane 26 with connectors 28 and 30, and bracket 34. Ribbons 50 provide I/O connectivity between the connectors 42 and 44 on card 40 and connectors 28 and 30 on backplane 26.

Figure 5:
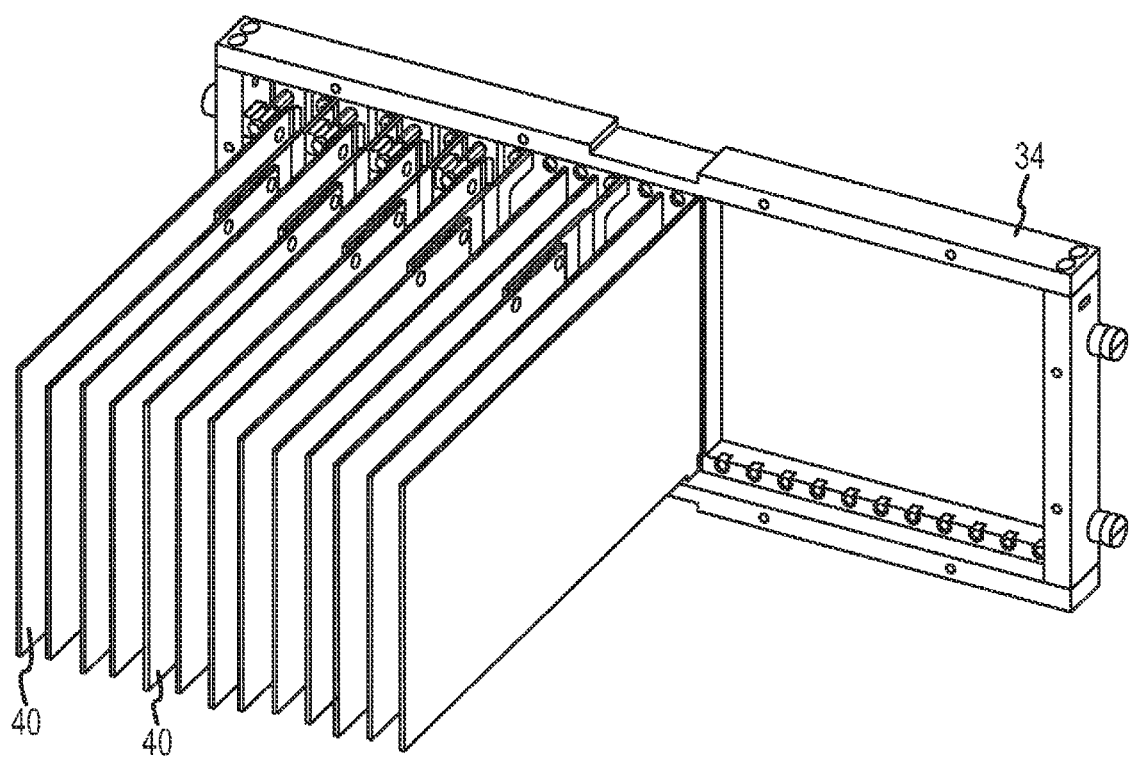
FIG. 5 illustrates a number of STA adapter cards mounted on a bracket.

As the skilled artisan will appreciate, a number of cards 40 may be inserted into the enclosure 24 and interconnected over the backplane 26. Cards 40 may be configured to perform resource-specific functionality as will be further described. Accordingly, resource-specific cards may be provided to perform the functionality. For example, a card 40 may be configured to perform self test functionality for an ATE DMM station resource, while an additional card 40 may be configured to perform self test functionality for an ATE power supply resource. FIG. 5 illustrates a number of such cards 40 mounted within the bracket 34.

Figure 6:
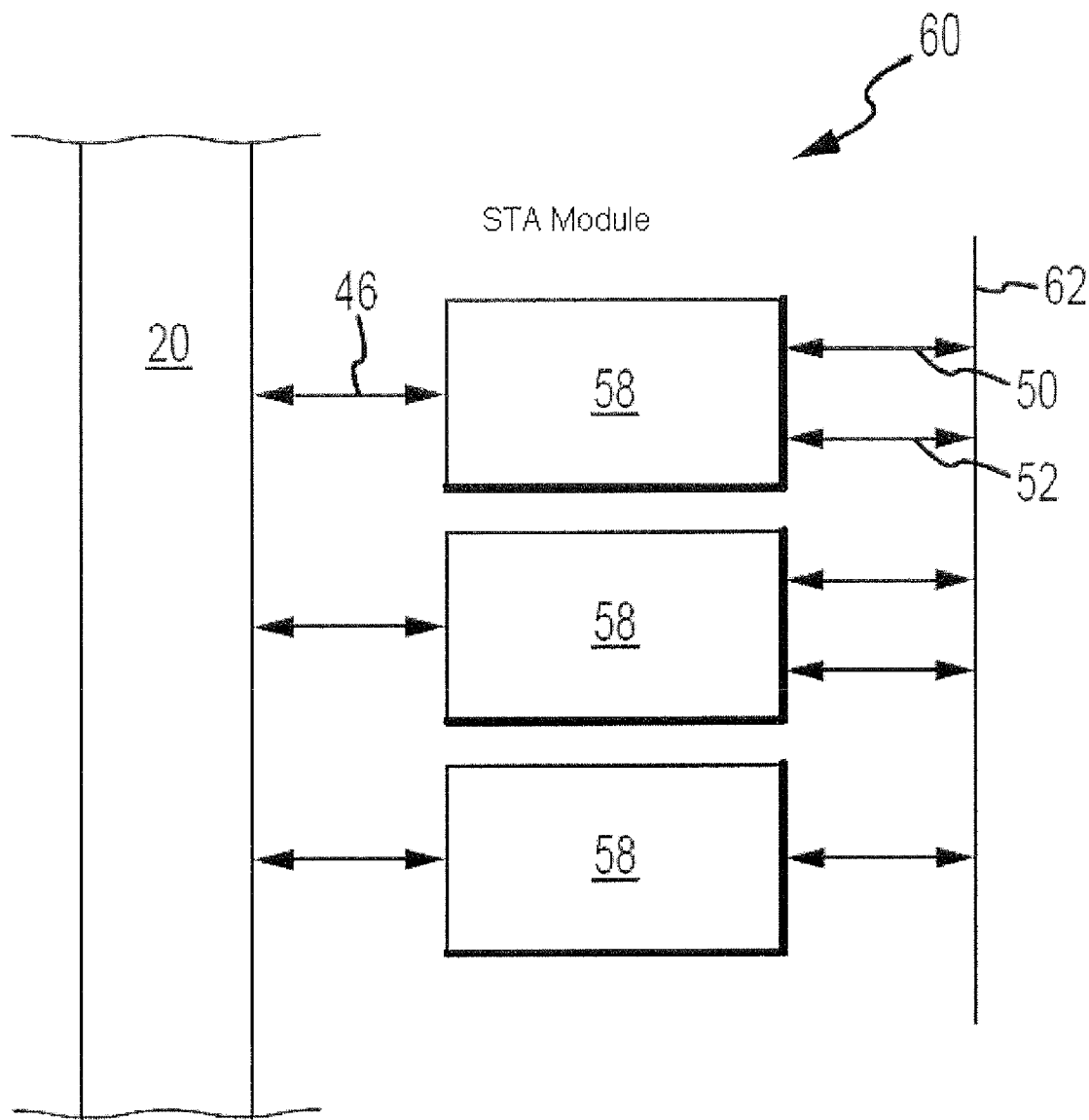
FIG. 6 illustrates a block diagram of a plurality of STA modules in communication with and between a backplane.

FIG. 6 illustrates a block diagram of interconnectivity between STA modules 58 (such as STA card modules 40), the backplane 26 (FIG. 2) incorporating the dual data bus 62, and the ATE station receiver 20. Modules 58 provide/process I/O from and to the receiver 20 via connector 46 (here represented as an arrow to denote signal transfer). Similarly, modules 58 provide/process I/O from and to an additional modules 58 over the dual data bus 62 via connectors 50 and 52 (here again represented as an arrow). Dual data bus 62 allows for full duplex communication between each of the modules 58. Dual data bus is integrated into backplane 26 (FIG. 2) as one skilled in the art will appreciate.

Figure 7:
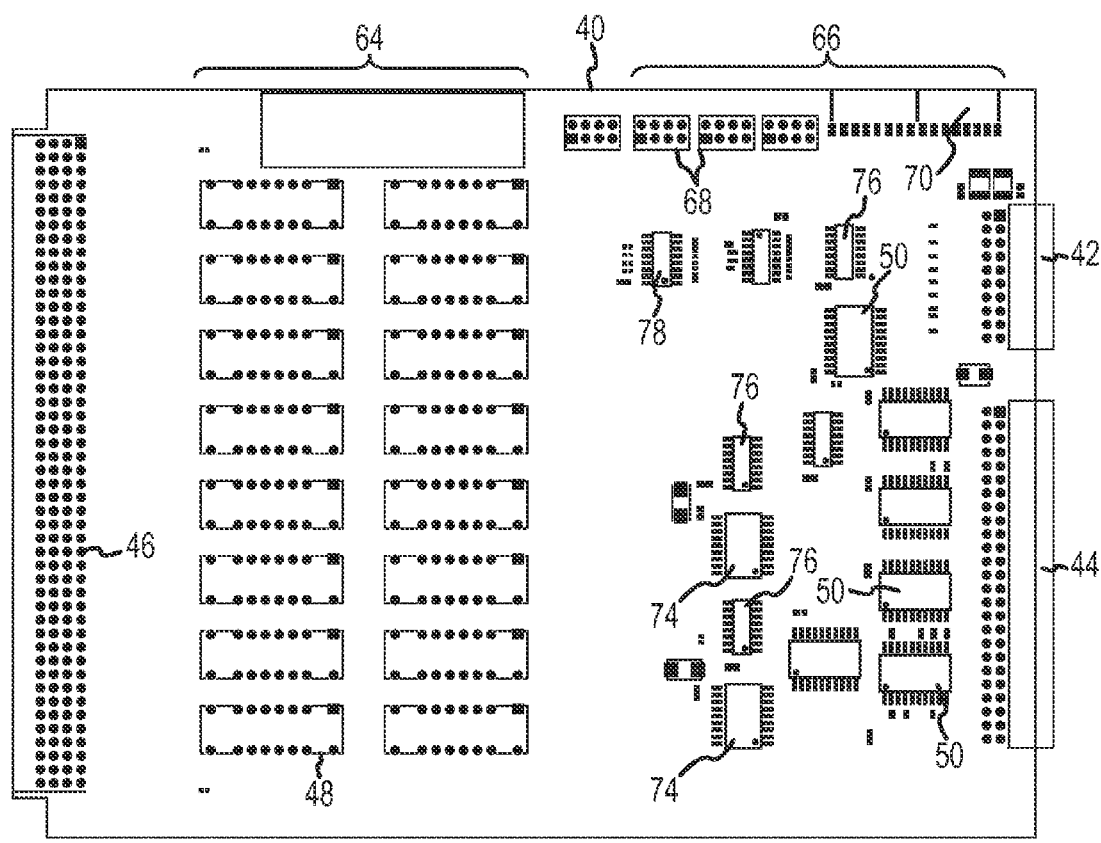
FIG. 7 illustrates an exemplary STA card configuration.

FIG. 7 illustrates an exemplary configuration of an STA card 40 for a particular ATE station resource. Here again, connectors 42, 44, and 46 are shown for I/O transfer through the card. In one embodiment, connector 44 facilitates digital I/O. STA card 40 is subdivided into a resource-specific region 64 and a generic, front end region 66. Resource-specific region 64 is adapted for a resource utilizing relays 48. Accordingly, a number of relays 48 are integrated into the STA card 40. In other embodiments, resource-specific region 64 may include loopback circuits and or line traces (not shown) providing loopback functionality of signal transfer through the card 40.

Generic front end region 66 is adapted for interfacing with another generic front end region 66 of another STA card 40. Generic front end region 66 ensures that communication between each STA card 40 is the same, and reduces software development and circuit design. In one embodiment, STA card 40 may be adapted as a non-controller card 40, where functionality such as card identification, slot verification, function control, and an input circuit(s) are provided. In other embodiments, STA card 40 may be adapted as a controller card 40, where an additional circuit is provided for bus control and other control functionality.

In the depicted embodiment, generic front end region 66 includes components such as line drivers 50, relay drivers 74 to driver relays 48 and provide component protection, shift registers 76 to reduce digital I/O, and a comparator 78 for slot ID verification. Generic front end region 66 also includes a resistor bank 70 for card identification and revision, and a number of functional light emitting diodes (LEDs) 68 to provide user notification.

Figure 8:
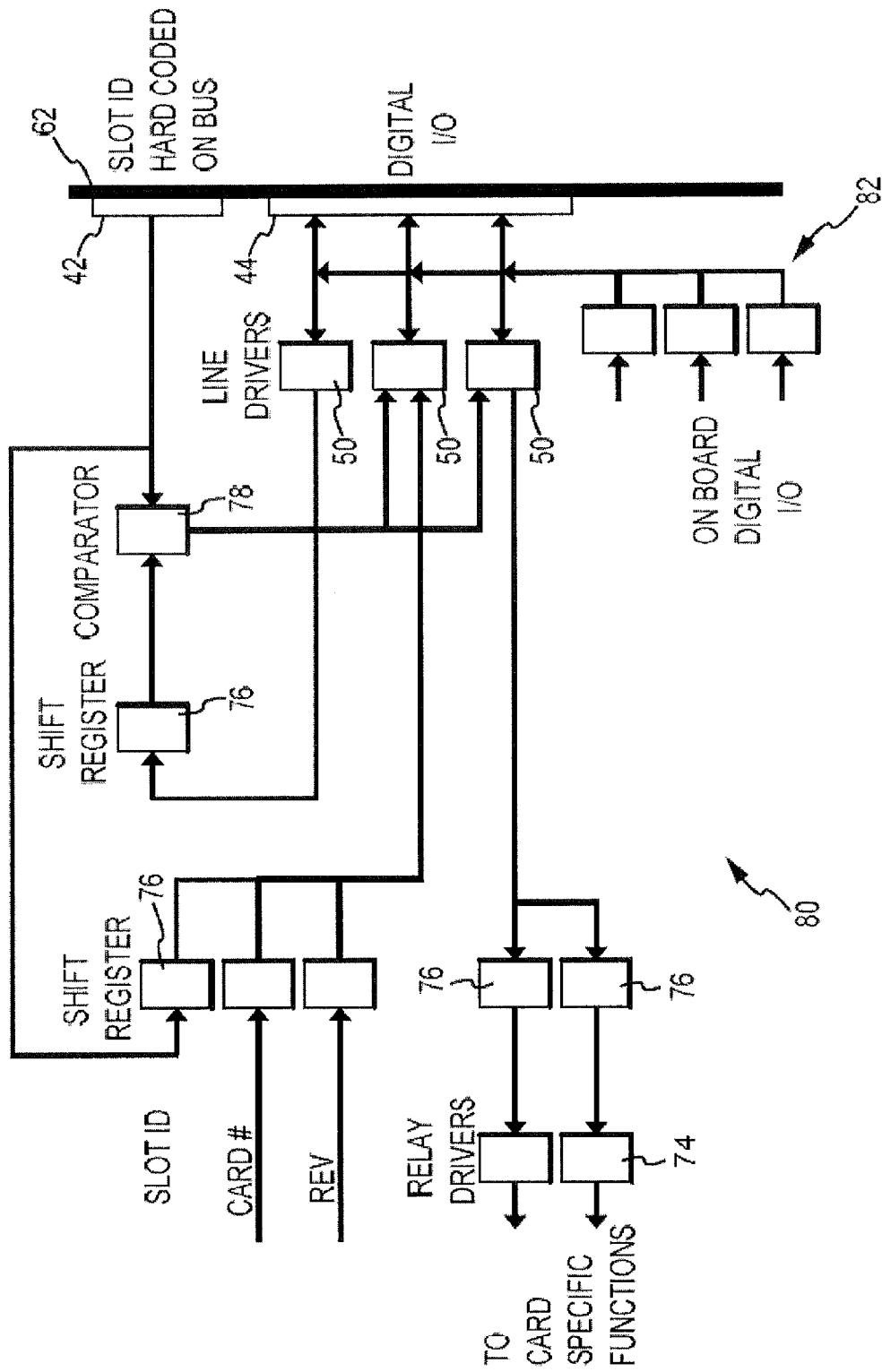
FIG. 8 illustrates a block diagram of an exemplary STA card configuration.

FIG. 8 depicts a block diagram of the configuration 80 of STA card 40 shown in FIG. 7. Again, connectors 42 and 44 are shown for signal connectivity to the backplane 26 (FIG. 2). Digital I/O is facilitated through connectors 44 to line drivers 50 and to shift register 76 as shown. In the depicted embodiment, the slot ID is hard coded on the dual data bus 62 (FIG. 6). I/O is provided through connector 42 to comparator 78, and provided through shift register 76. I/O is provided from line driver 50 through relay driver 74 to card specific functions. An onboard region 82 facilitates digital I/O. The skilled artisan will appreciate that firmware and software may be tailored to drive the functionality shown by configuration 80.

Those of ordinary skill in the art will appreciate that the hardware depicted in FIGS. 1-8 may vary. For example, other electronic components, such as transistors, diodes, capacitors, controllers and the like, also may be used in addition to or in place of the hardware depicted. The depicted example is not meant to imply architectural limitations with respect to the present invention.

For example, in one embodiment, the STA may be a multi-tiered implementation. A first tier may interface with a first level of receiver connectors, while a second tier may interface with a second level of receiver connectors, and so forth. Accordingly, a tiered enclosure having at least two levels is contemplated. The backplane may span one or both tiers, as the skilled artisan will appreciate. Other implementations may use a series of interconnected backplanes, one for each tier.

Some of the functional units described in this specification have been referred to as "modules" in order to more particularly emphasize their implementation independence. For example, functionality referred to herein as a module may be implemented wholly, or partially, as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented in software for execution by various types of processors. An identified module of executable code may, for instance, comprise one or more physical or logical modules of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

While one or more embodiments of the present invention have been illustrated in detail, the skilled artisan will appreciate that modifications and adaptations to those embodiments may be made without departing from the scope of the present invention as set forth in the following claims.

What is claimed is:

1. A self test adapter (STA) for automatic test equipment (ATE), comprising:
    an enclosure;
    a backplane housed by the enclosure;
    a dual data bus integrated into the backplane; and
    at least one STA card module for insertion into the backplane, the at least one STA card module having a port for interconnection with an ATE station receiver, wherein the at least one STA card module includes a generic region adapted for interfacing with another generic region of an additional STA card module, and a resource specific region adapted for self test of at least one ATE station resource.

2. The self test adapter of claim 1, wherein the at least one STA card module is integrated into a printed circuit board (PCB).

3. The self test adapter of claim 1, wherein the generic region includes a plurality of line drivers in communication with the dual data bus.

4. The self test adapter of claim 1, wherein the generic region includes a plurality of relay drivers in communication between at least one line driver and a relay.

5. The self test adapter of claim 1, wherein the generic region includes at least one shift register and a comparator for STA card module identification.

6. The self test adapter of claim 1, wherein the at least one STA card module further includes at least one functional light emitting diode (LED) for user notification.

7. The self test adapter of claim 1, wherein the resource specific region includes at least one relay.

8. The self test adapter of claim 1, wherein the resource specific region includes one of a loopback circuit and a trace.

9. A method of manufacturing a self test adapter (STA) for automatic test equipment (ATE), comprising:
    providing an enclosure;
    providing a backplane housed by the enclosure;
    providing a dual data bus integrated into the backplane; and
    providing at least one STA card module for insertion into the backplane, the at least one STA card module having a port for interconnection with an ATE station receiver, wherein the at least one STA card module includes a generic region adapted for interfacing with another generic region of an additional STA card module, and a resource specific region adapted for self test of at least one ATE station resource.

10. The method of manufacture of claim 9, further including integrating the at least one STA card module into a printed circuit board (PCB).

11. The method of manufacture of claim 9, further including providing at least one of a plurality of line drivers in communication with the dual data bus, a plurality of relay drivers in communication between at least one line driver and a relay, a shift register and a comparator for STA card module identification, and a functional light emitting diode (LED) for user notification.

12. The method of manufacture of claim 9, further including performing one of integrating at least one relay, a loopback circuit, and a trace into the resource specific region.

* * * * *